United States Patent [19]
Ernyei et al.

[11] 4,163,960
[45] Aug. 7, 1979

[54] ELECTROMECHANICAL FILTER STRUCTURE

[75] Inventors: Herbert Ernyei; Etienne Langlois, both of Paris, France

[73] Assignee: Societe Lignes Telegraphiques et Telephoniques, Paris, France

[21] Appl. No.: 862,906

[22] Filed: Dec. 21, 1977

[30] Foreign Application Priority Data

Dec. 30, 1976 [FR] France .......................... 76 39576
Apr. 25, 1977 [FR] France .......................... 77 12410

[51] Int. Cl.² .............................. 333 197; H03H 9/26; H03H 9/24; H03H 9/04
[52] U.S. Cl. .................................................. 333/198
[58] Field of Search ........................... 333/71, 72; 310/328-333

[56] References Cited
U.S. PATENT DOCUMENTS

| 3,336,541 | 8/1967 | Ura | 333/72 |
| 3,445,792 | 5/1969 | Börner et al. | 333/71 |
| 4,060,774 | 11/1977 | Ernyei | 333/71 |

FOREIGN PATENT DOCUMENTS 2213875 10/1973 Fed. Rep. of Germany ............ 333/71

Primary Examiner—Alfred E. Smith
Assistant Examiner—Marvin Nussbaum
Attorney, Agent, or Firm—Kemon & Estabrook

[57] ABSTRACT

An electromechanical filter comprising resonators interconnected by couplers and at least one bridge strapping over several resonators in which said resonators are longitudinally vibrating, said couplers and bridge are bending and the number of strapped resonators is a multiple of four. Such a filter shows improved phase characteristic within the pass band.

4 Claims, 10 Drawing Figures

ELECTROMECHANICAL FILTER STRUCTURE

BACKGROUND OF THE INVENTION AND PRIOR ART

The present invention concerns electromechanical filters of the type having at least one pole or maximum attenuation in the neighbourhood of the pass band. It relates to a filter structure of this type which is of simple mechanical construction, which permits industrial production and which ensures high quality of the transmission in the band to be transmitted.

Electromechanical filters consist essentially of a set of resonators, generally metal rods of cylindrical form, of which the dimensions are selected so that the said bars constitute circuits tuned to a preselected frequency in a chosen mode of vibration. These rods are interconnected by means of couplers, which generally consist of metal wires vibrating in a preselected mode and ensuring mechanical coupling between adjacent resonators. One of the resonators, called the input resonator, is associated with a transducer which changes an electrical input signal into a corresponding mechanical displacement in the mode of vibration chosen for the said rod; likewise, a second rod of the set, called the output resonator, is associated with a second transducer which effects the inverse conversion. The transducers are connected to the input and output terminals respectively of the filter. Such filters have been the subject of many developments which have been abundantly described in the technical press and patents, such as the following patent applications filed by the Assignee: Ser. No. 695,920 for "Electromechanical band-pass filter for high frequencies" dated 14th June, 1976 now U.S. Pat. No. 4,060,774 and Ser. No. 742,467 for "Electromechanical filter" dated 17th Nov., 1976 now U.S. Pat. No. 4,160,506.

It is known (see the article by R. A. JOHNSON, published in the report of the Symposium on Circuits and Systems Newton—April 1975, organized by the Institute of Electrical and Electronic Engineers) to create poles in the transmission characteristic by disposing auxiliary couplers between non adjacent resonators which will be termed "bridges" in the following text. The work which forms the subject of the aforesaid publication is summarized in the form of Table I.

Table I

| Number of resonators between ends of the bridge | Mechanical length of the bridge | Adjacent poles off the pass-band |
|---|---|---|
| 2n | $3\lambda/4 + p\lambda$ | 1 pole on each side of the band |
| 2n | $\lambda/4 + p\lambda$ | phase corrector (2 conjugate complex poles) |
| 2n − 1 | $3\lambda/4 + p\lambda$ | 1 pole of frequency lower than the band |
| 2n − 1 | $\lambda/4 + p\lambda$ | 1 pole of frequency higher than the band | where
 n is a positive integer other than zero,
 p is a positive integer or zero and
 $\lambda$ the wavelength at the central frequency of the filter in the mode of vibration chosen for the bridge.

In regard to the construction, it is important to minimize the length of the bridges in order to eliminate any danger of accident being introduced into the characteristic by a parasitic oscillation at a natural frequency of the said bridge. It is therefore desirable to limit the length of the bridge to one quarter or three quarters of the wavelength in the mode of vibration used (p=0 in Table I). In order to make the interconnection between non adjacent resonators, this length must be at least equal to that of the couplers between said resonators and, generally, even longer, because it is necessary to straddle a number of resonators. Therefore, there is incompatibility between the condition of minimum length of the bridge and the physical length necessary for the interconnection of non adjacent resonators.

There has been described in DOS No. 22 13 875, filed in the German Federal Republic on the 22nd Mar., 1972 by Licentia, a filter structure aimed at solving this problem, wherein the resonators are distributed in at least two separate planes, with their longitudinal axes parallel to a given direction. The bridge can then join two resonators belonging to two different planes. In all the constructional examples illustrating this patent application, the bridge straddles two intermediate resonators and no precise particulars are given with regard to the response curve of such a filter.

BRIEF SUMMARY OF THE INVENTION

The present invention has essentially for its object to provide an electromechanical filter in which the resonators are disposed in at least two different planes parallel to one another and parallel to the direction of the axes of the resonators, and having at least one bridge between resonators belonging to two different planes, characterized in that it comprises longitudinally vibrating resonators which are interconnected by couplers vibrating in bending and in that the said bridge which also vibrates in bending straddles a number of resonators which is a multiple of 4.

The use of longitudinally vibrating resonators associated with couplers vibrating in bending makes it possible to employ identical couplers between adjacent resonators and to make their length equal to one quarter of the wavelength of the chosen mode of vibration. It is known that such elements have a resonance frequency which is less sensitive to small variations in mechanical length than that of any other type of resonator, which permits machining tolerances of the resonators which can be more readily achieved. The distance between the planes of the resonators is reduced to this value, with the result that very compact structures are obtained.

The use of a bridge which straddles a number of resonators which is a multiple of 4 makes it possible to improve considerably the transmission characteristic of the filter in the pass band and more particularly the phase characteristic, as will hereinafter be shown with reference to experimental curves.

The use of a filter structure according to the invention associated with input and output transducers makes it possible to reduce the parasitic coupling between transducers which are close together by inverting the relative positions of the resonators on which the transducers are mounted.

BRIEF DESCRIPTION OF THE DRAWINGS

The invention will be readily understood by reference to the following description and the accompanying figures which are given by way of non limiting illustration and in which.

DETAILED DESCRIPTION OF THE INVENTION

Figure 1:
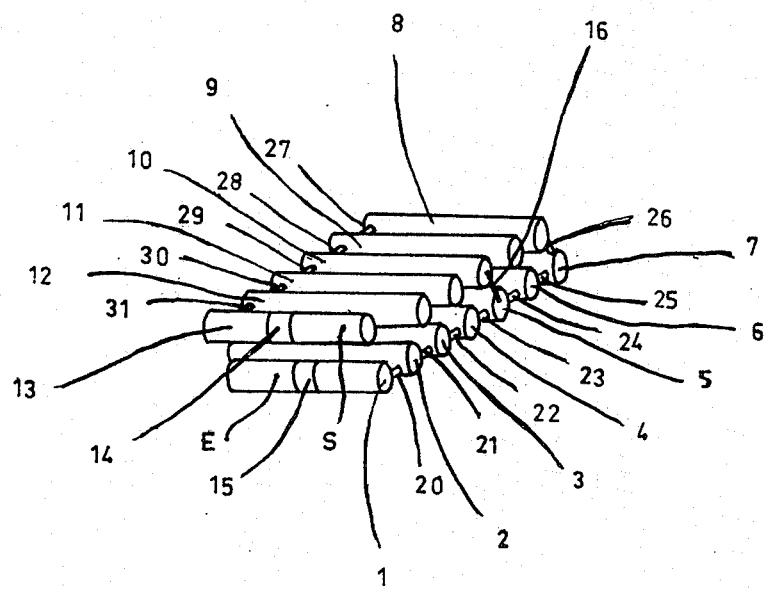
FIG. 1 illustrates a preferred variant of the invention.

FIG. 1 illustrates a preferred structure according to the invention. It comprises thirteen bars 1 to 13 constituting the resonators distributed in two planes and parallel to one another. The transducers 14 and 15 are associated with the outside bars of the filter which are connected to the input E and the output S respectively. The bars, which vibrate longitudinally, are connected by couplers 20, 21, 22, 23, 24, 25, 26, 27, 28, 29, 30 and 31 which vibrate in bending and whose length is close to one quarter of the wavelength at the central frequency of the pass band. The bridge 16, which vibrates in bending and which is disposed between the bars 5 and 10, straddles the bars 6, 7, 8 and 9. The filter thus constructed is of the type corresponding to the first line of Table I (two poles symmetrical about the central frequency). The characteristics of the bridge (diameter and length for a given material) are determined as will hereinafter be explained.

As is known, the couplers 20 to 26 and 27 to 31 respectively may consist each of one unitary wire. Likewise, the manner in which the couplers are fixed to the resonators and the optimum position of the point of contact along the rod lie outside the scope of the present invention. It is known to connect the couplers at a point of the resonator which corresponds to a node for a mode of parasitic (unwanted) vibration whose resonance frequency is in the neighbourhood of the band to be transmitted, for the purpose of improving the transmission characteristic of the filter.

It will be seen that bridge 16 disposed parallel to coupler 26 connects two resonators which each belong to a different plane. The mechanical length of bridge 16 is equal to that of coupler 26 owing to the distribution of the rods in two parallel planes. The radius of bridge 16, defined as hereinafter explained, is a function of the frequency of the pole and the numerical value obtained is lower than that of the radius of a coupler. Since the bridge and the coupler vibrate in the same bending mode, the mechanical lengths which ensure resonance are different. The mode of fixation and the tilting of the bridge in relation to the normal to the planes defined by the axes of the resonators make it possible to build up the structure with the correct dimension of its parts.

Figure 2:
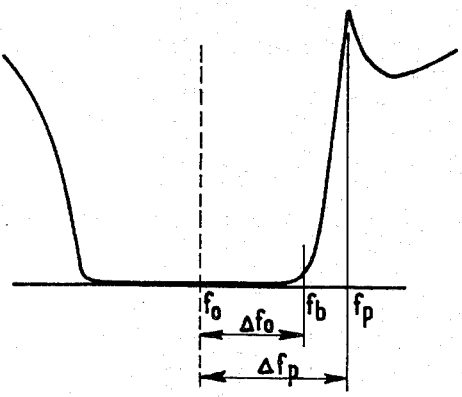
FIG. 2 is intended to define the notations employed.

FIG. 2 diagrammatically illustrates a transmission curve of a filter having a wide band $2\Delta f_o$ about a central frequency $f_o$. If $f_b$ is the upper terminal of the transmitted band, we have $\Delta f_o = f_b - f_o$; $f_p$ is the frequency of the pole, which is assumed to be above $f_b$ and close thereto, and we set: $\Delta f_p = f_p - f_o$. These notations are used in the following text.

Figure 3:
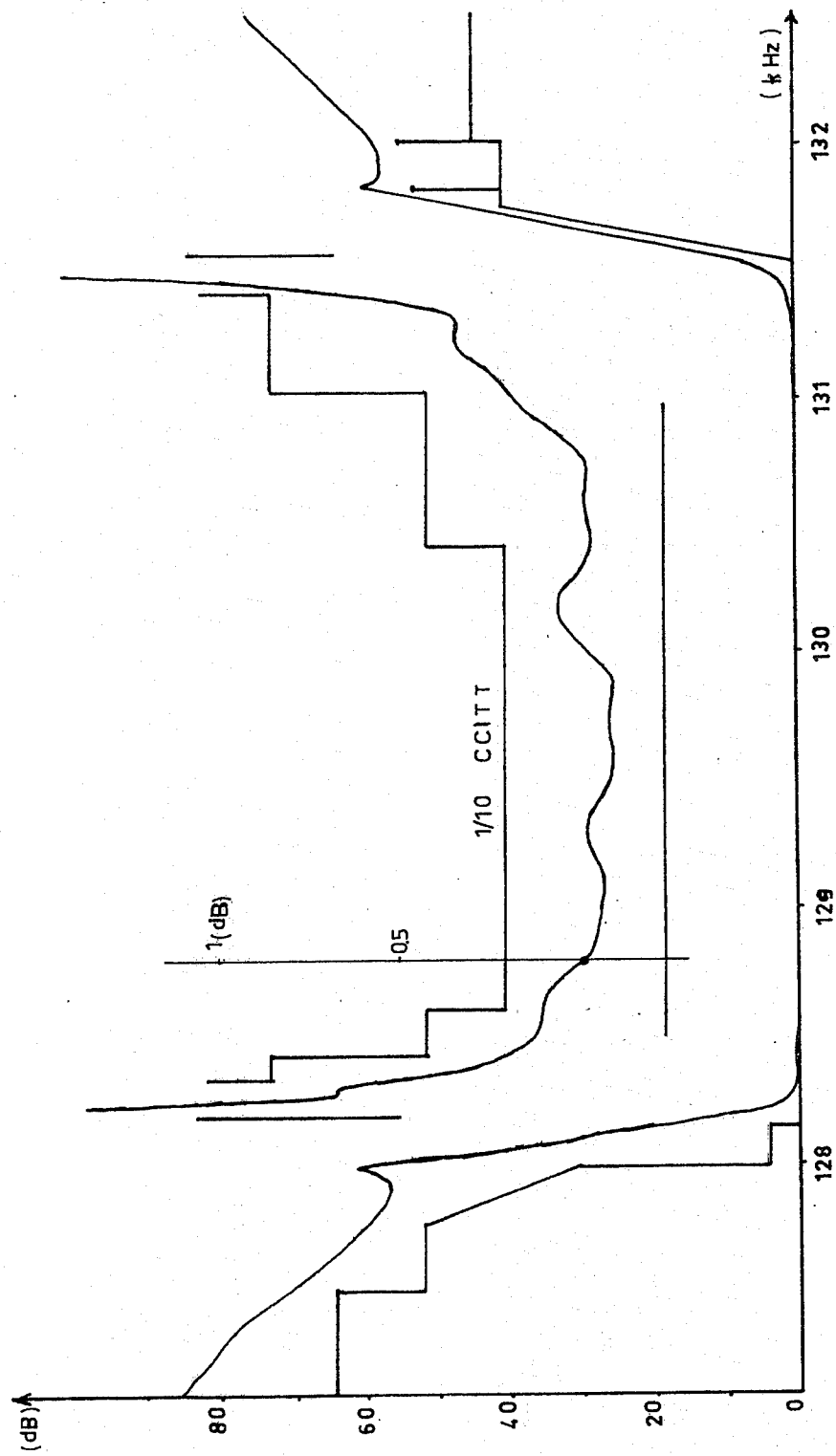
FIGS. 3 and 4 are characteristic curves of the filter of FIG. 1, FIGS. 5 and 6 are curve diagrams which can be used in the calculation of the filters according to the invention.
Figure 4:
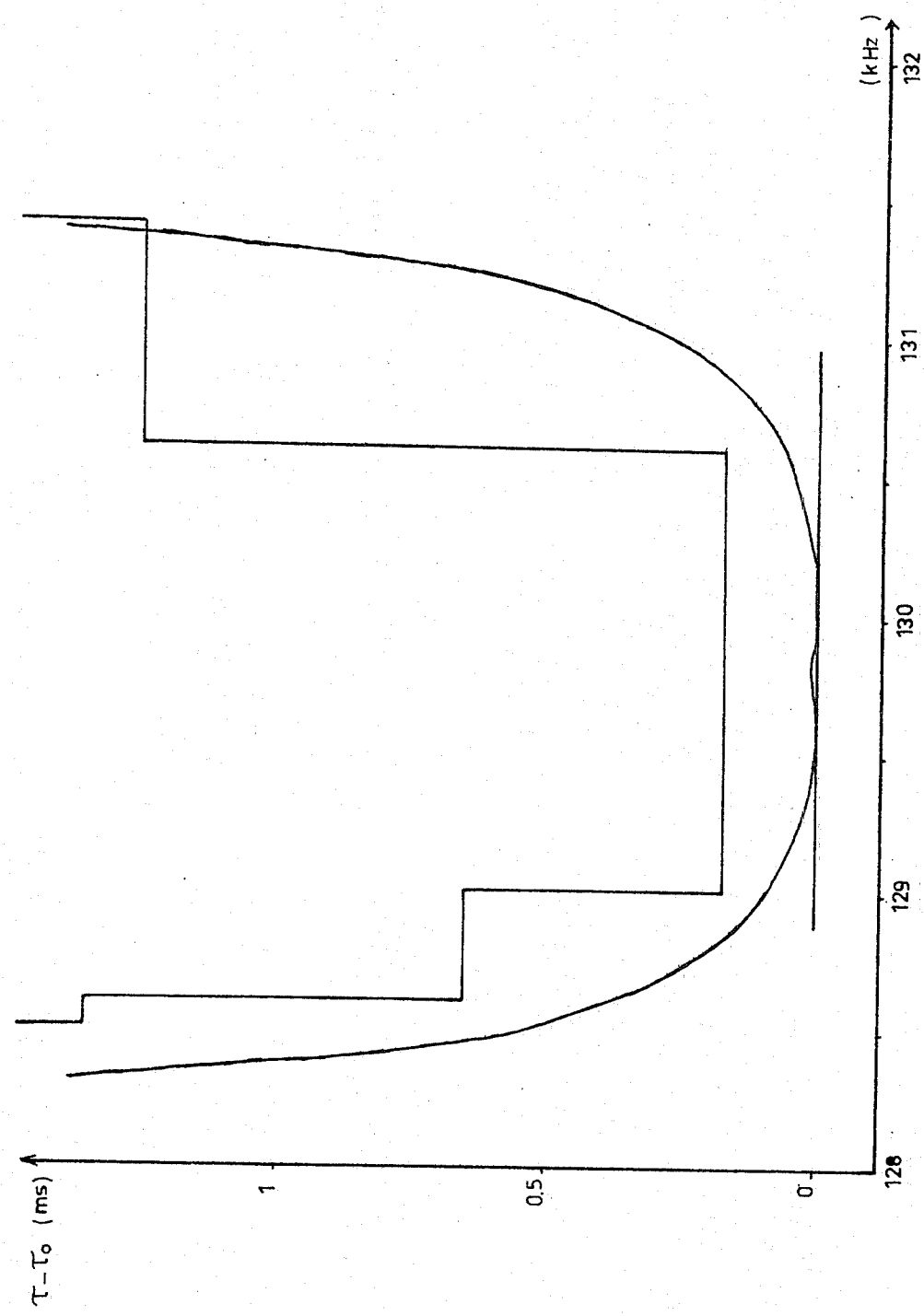

FIGS. 3 and 4 show the transmission characteristics in amplitude and in phase respectively of the filter of FIG. 1. This filter is so designed as to have a pass band centered on 129.85 kHz and a half bandwidth of 1.7 kHz; the poles are disposed at 1.975 kHz from the central frequency. With the foregoing notations $\Delta f_o = 1,700$ Hz and $\Delta f_p = 1,975$ Hz and $|\Delta f_p / \Delta f_o| = 1.16$.

The curve of FIG. 3 is a measured on a filter having the following characteristics: the thirteen resonators have a length corresponding to a half wavelength at the central frequency $f_o$ of the pass band in the first longitudinal mode. The couplers have a length corresponding to one quarter of the wavelength at the frequency $f_o$ for the first bending mode; the length of the bridge corresponds to three quarters of the wavelength of the bending mode at $f_o$ (cf. line 1 of Table I). The diameters of the various elements constituting the filter are kept at the same value as those chosen for constructing a filter without bridge which has the same response curve in the same band of transmitted frequencies, which are determined in the manner known to the person skilled in the art (for example Tschebycheff or Butterworth approximations).

Let us assume that the parameters of the filter of FIG. 1 are to be determined. It is well known to the person skilled in the art tht some parameters can be made equal in order to simplify production. Thus, it is suitable either to use identical resonators or identical couplers, the values of the parameters of the other elements varying from one cell to the other. The choice of the vibration modes and the bulk make it preferable to choose minimum lengths for the resonators and the couplers.

The radius $r_{16}$ of the bridge 16 is a function of the frequency $f_p$ of the pole; the latter is expressed in relation to the bandwidth of the filter (cf. FIG. 2) of central frequency $f_o$ by the expression:

$$r_{16} = r_c F(\Delta f_p / \Delta f_o)$$

where $r_c$ is the radius of the couplers 20 . . . 31, etc. The function $F(\Delta f_p / \Delta f_o)$ is explained in the following.

Assuming that the bridge is made of the same material as the couplers, the identity of the mode of vibration (bending) of the two elements makes it possible to write $$\frac{Y_p}{Y_c} = \left(\frac{d_c}{d_p}\right)^{5/2} \tag{1}$$

where
$Y_p$ = mobility of the bridge
$Y_c$ = mobility of the coupler
$d_c$ = diameter of the coupler = $2r_c$
$d_p$ = diameter of the bridge = $2r_{16}$ Explanations leading to equation (1) are given in Mr. Börner's article published in the Telefunken Zeitung, vol. 37 (1964) issue 3–4 page 242 and 240. Equation 50, page 242, shows that the coupling coefficient $k_{12}$ is proportional to $R^{5/2}$ where R is the radius of the resonator. Equation 29, page 240, of the same paper shows that the said coupling coefficient is proportional to the reciprocal of fixity Z, that is proportional to the mobility Y.

The bridged part of the filter may be regarded as a set of m cells of the unbridged filter, m being the number of bridged couplers. Each of the bridged cells, assumed to be identical, is represented by a transfer matrix of the form $$M_1 = \begin{vmatrix} A_1 & B_1 \\ C_1 & A_1 \end{vmatrix} \text{ and } M_m = \begin{vmatrix} A_1 & B_1 \\ C_1 & A_1 \end{vmatrix}^m = \begin{vmatrix} A_m & B_m \\ C_m & A_m \end{vmatrix}$$

where $M_m$ is the matrix of the set of m bridged cells. The bridge is represented by a matrix $M_p$ of the same type, defined by the terms $A_p$, $B_p$ and $C_p$. The bridged part of the filter is represented by the matrix $$M_E = \begin{vmatrix} A_E & B_E \\ C_E & A_E \end{vmatrix}$$

resulting from the parallel arrangement of the bridge ($M_p$) and of the m bridged cells ($M_m$).

Matrix $M_1$ is by itself the product of three matrices. Simplifications relying on the small width of the pass band allow to write:

$$A_1 = -\frac{\Delta f}{\Delta f_o} \text{ and } B_1 = jY_c \cos\left(\frac{\pi}{2} \frac{\Delta f}{f_o}\right) \quad (2)$$

and $$B_p = j\epsilon Y_p \cos\left[(2K-1)\frac{\pi}{2} \frac{\Delta f}{f_o}\right] \quad (3)$$

where
$\epsilon = 1$ if K is odd
$\epsilon = -1$ if K is even.
In the present case $K=2$ and $\epsilon = -1$.

Calculation shows that, where n is the number of bridged resonators ($n=m-1$), we have:
$A_m = g_n(A_1)$ where $g_n$ is a function depending upon n
$B_m = B_1 f_n(A_1)$, where $f_n$ is a function depending upon n.

Likewise, $A_E = \dfrac{A_m}{1 + B_m/B_p}$

The condition for the existence of the poles is that $A_E$ should be infinite, that is to say that at $\Delta f = \Delta f_p$ $$1 + B_m/B_p = 0 \quad (4)$$

The association of equations (1), (2) and (3) gives:

$$\left(\frac{d_c}{d_p}\right)^{5/2} = \frac{Y_p}{Y_c} = f_n(A_1) \text{ (at the frequency of the poles } \pm f_p\text{)}.$$

Figure 5:
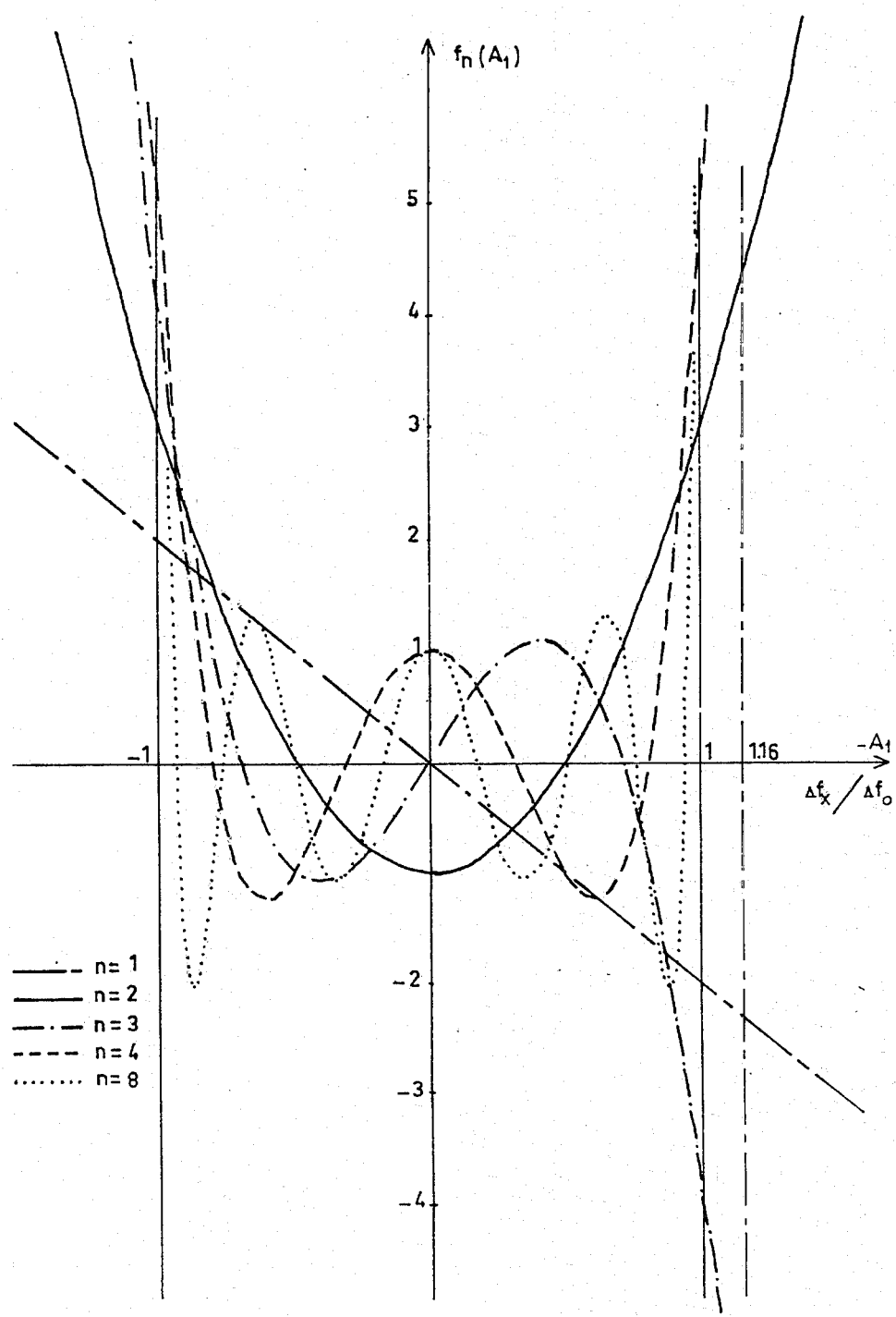

The curves of FIG. 5 represent various functions $f_n$ for different values of n, which can be traced from the foregoing calculation. The filter of FIG. 1 corresponds to $n=4$. The value $f_4(A_1)$ for $\Delta f_p/\Delta f_o = 1.16$ is obtained by the intersection of the curve $y=f_4(A_1)$ with the straight line $X=1.16$. There is thus obtained the value of the ratio of the diameters, depending upon the length of the bridge $(3(\lambda/4)$ in the case of FIG. 1).

The amplitude distortion in the pass band results from the presence of the term $B_m/B_p$ in the term $A_E$.

Figure 6:
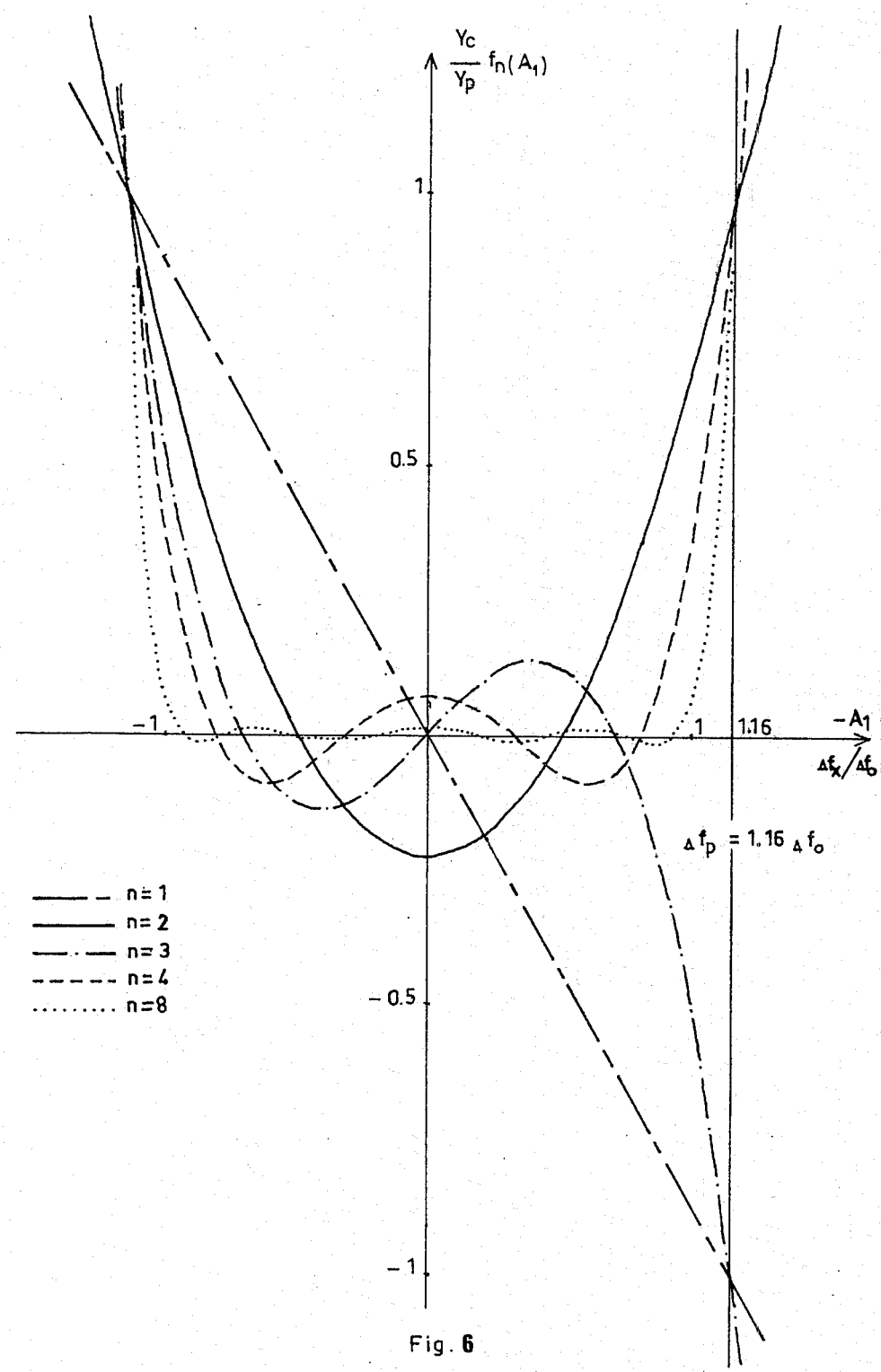

The curves of FIG. 6 show that the distortion decreases when n increases. They are acceptable by the majority of users when n is equal to four. The curves of FIG. 6 are obtained from those of FIG. 5 by multiplying the ordinates by $Y_c/Y_p$, where $Y_c$ is the mobility of the coupler of a bridged cell
$Y_p$ is the mobility of the bridge.

However, some uses may necessitate a greater reduction of the amplitude distortions in the transmitted band. It is then necessary to use a bridge which straddles a larger number of unitary cells.

An unexpected advantage of the filters according to the invention resides in the improvement of the phase characteristic over that of a filter whose bridge does not obey the condition of straddling 4n resonators.

Figure 7:
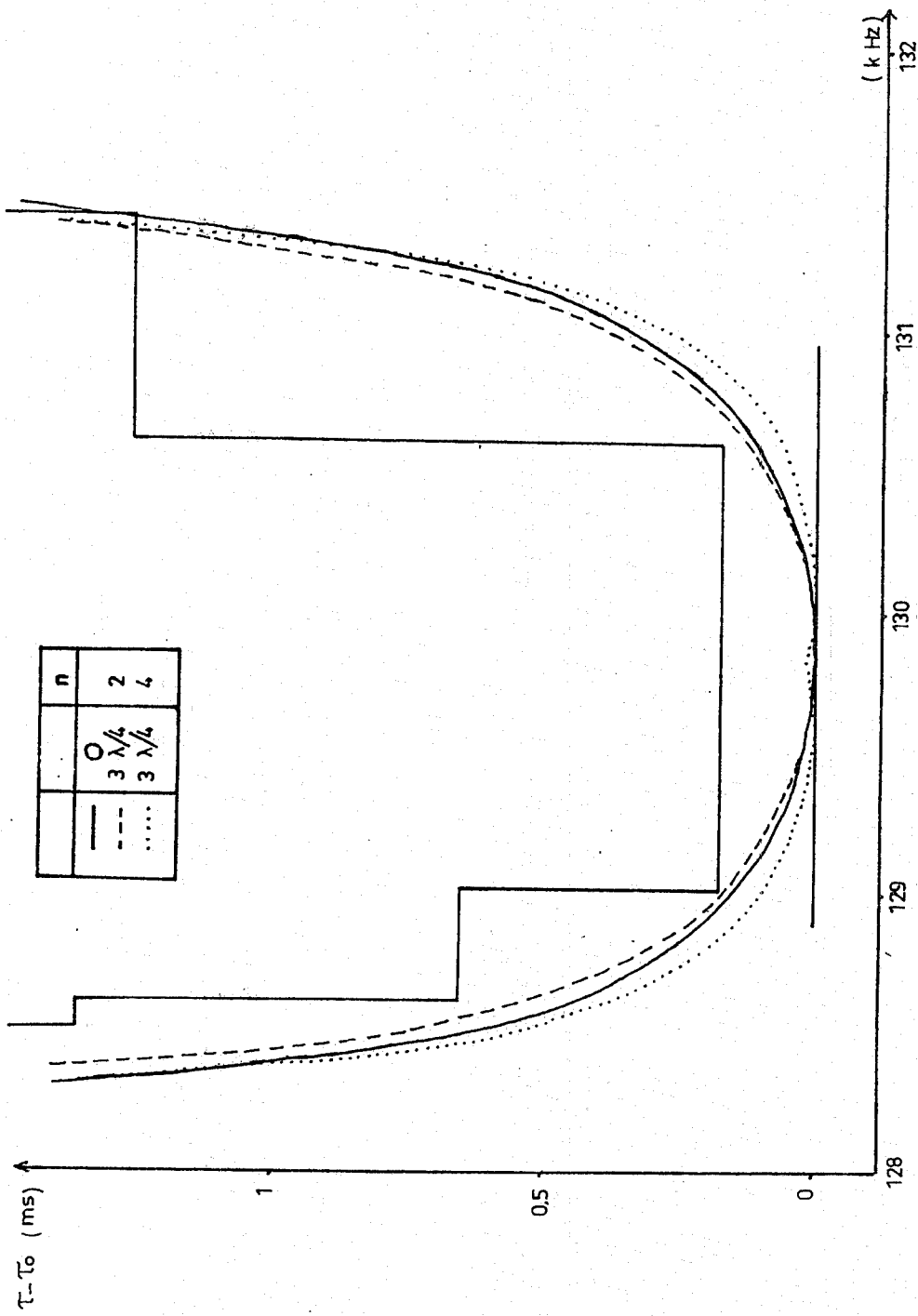
FIG. 7 shows the influence of the number of resonators straddled by the bridge on the characteristic curve.

FIG. 7 shows as a solid line the group delay variation as a function of the frequency in the case of a filter without bridge, the dotted curve representing the same variation in the case of a filter with a $3\lambda/4$ bridge over four resonators; it will be seen that this curve more readily fits into the gauge. Only filters having a bridge straddling a number of resonators which is a multiple of four have this advantage, as is shown by the chain-lined curve (FIG. 7) representing the response of a filter having a $3\lambda/4$ bridge over two resonators.

Figure 8:
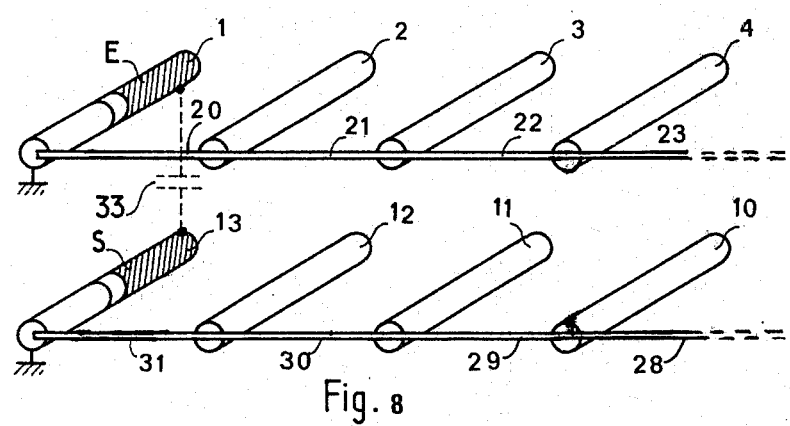
FIGS. 8 and 9 are fragmentary diagrams of the terminations of the filter.
Figure 9:
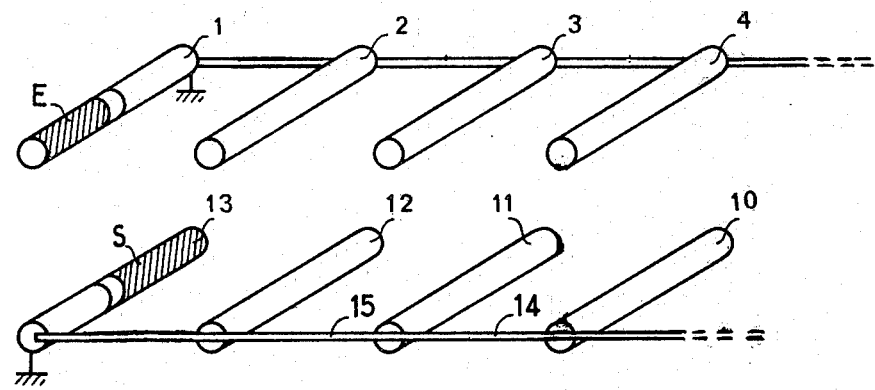

In accordance with a variant of the invention, the parasitic capacitive coupling (represented by 33 in FIG. 8) between the input transducer 14 and the output transducer 15 which results from their proximity due to the disposition of the bars in two parallel planes is compensated for by an electrical arrangement by which voltage is applied to two opposite halves (represented by hatching) of the outermost bars 1 and 13, as shown in FIG. 9. The unhatched halves of the bars are connected to that face of the transducer which is maintained at earth potential. By increasing the distance between the elements between which a potential difference exists, the capacitive coupling is minimized.

Figure 10:
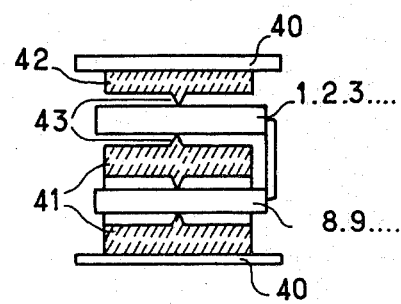
FIG. 10 illustrates a filter arrangement according to the invention.

In a preferred construction of the filter, the two planes of resonators are fixed in a casing 40 by a very flexible material, for example silastene (FIG. 10), of which a lower portion 41 forms a block in which the lower row of resonators 8, 9 slides. The upper row is held by the upper side of the block and another silastene slab 42, which is adhesively secured to the upper part of the casing 40. The silastene locks the resonators only at the vibration node, for example at the centre in the present case. It is profiled for this purpose at 43.

The foregoing examples concern filters whose characteristic exhibits two poles. Of course, if it is desired to obtain one or a higher number of poles, it will be necessary to use one or a number of bridges of different lengths; the characteristics of each bridge are defined on the basis of the foregoing considerations.

What we claim:
1. An electromechanical band pass filter having a central frequency $f_o$ comprising:
   a plurality of cylindrical resonators $\frac{1}{2}\lambda$ long at the fundamental longitudinal vibration arranged in spaced first and second rows with their longitudinal axes parallel;
   first coupling means coupling adjacent resonators in said first row;
   second coupling means coupling adjacent resonators in said second row;
   third coupling means coupling the last resonators at the same end of said first and second rows, said first, second and third coupling means being $\frac{1}{4}\lambda$ at the fundamental bending vibration;

an input transducer connected to that resonator in one of said rows which is at the end opposite said third coupling means;
an output transducer connected to that resonator in the other of said rows which is at the end opposite said third coupling means;
at least one bridge coupling two nonadjacent resonators such that said bridge spans a number of intercoupled resonators which number is a multiple of four; and
means biasing said transducers through one part of said resonators.

2. An electromechanical filter according to claim 1 wherein the axes of adjacent resonators in each row are spaced apart by $\frac{1}{4}\lambda$ in the bending mode at the central frequency of the filter.

3. An electromechanical filter according to claim 2 wherein those parts of the input and output resonators which are connected to said biasing means for said transducers are spaced apart to minimize capacitive coupling therebetween.

4. An electromechanical filter according to claim 2 wherein said bridge has a length equal to $\frac{3}{4}\lambda$ of the bending mode $f_o$.

* * * * *